US009781865B2

(12) United States Patent
Roth

(10) Patent No.: US 9,781,865 B2
(45) Date of Patent: Oct. 3, 2017

(54) SYSTEM AND METHOD OF COOLING AND VENTILATING FOR AN ELECTRONICS CABINET

(76) Inventor: Jason Todd Roth, Orlando, FL (US)

( * ) Notice: Subject to any disclaimer, the term of this patent is extended or adjusted under 35 U.S.C. 154(b) by 921 days.

(21) Appl. No.: 12/243,213

(22) Filed: Oct. 1, 2008

(65) Prior Publication Data

US 2010/0078157 A1 Apr. 1, 2010

Related U.S. Application Data

(60) Provisional application No. 61/049,997, filed on May 2, 2008.

(51) Int. Cl.
| | |
|---|---|
| *F28F 13/00* | (2006.01) |
| *F25D 23/12* | (2006.01) |
| *H05K 7/20* | (2006.01) |
| *H05K 5/00* | (2006.01) |

(52) U.S. Cl.
CPC ................. *H05K 7/20745* (2013.01)

(58) Field of Classification Search
CPC ........... H05K 7/20554; H05K 7/20572; H05K 7/20536; H05K 7/206; H05K 7/20609; H05K 7/20709; H05K 7/20718; H05K 7/20754; H05K 7/20745; H05K 7/2059; H05K 5/0213
USPC ............ 454/184; 361/695, 716, 721, 679.49, 361/690, 694, 724; 174/15.1, 16.1; 165/104.33, 104.28; 62/259.2
See application file for complete search history.

(56) References Cited

U.S. PATENT DOCUMENTS

| | | | | |
|---|---|---|---|---|
| 3,032,150 A | * | 5/1962 | Herbert, Jr. ............ | B21D 47/00 29/455.1 |
| 5,428,503 A | * | 6/1995 | Matsushima et al. ........ | 361/695 |
| 5,544,012 A | * | 8/1996 | Koike ............................ | 361/695 |
| 5,851,143 A | * | 12/1998 | Hamid .............................. | 454/57 |
| 6,948,021 B2 | * | 9/2005 | Derrico et al. ............... | 710/302 |
| 6,990,817 B1 | * | 1/2006 | Bhatia .................................. | 62/5 |
| 7,059,400 B2 | * | 6/2006 | Sekhar et al. ................ | 165/205 |
| 7,309,279 B2 | * | 12/2007 | Sharp et al. .................. | 454/184 |
| 7,508,663 B2 | * | 3/2009 | Coglitore ..................... | 361/695 |
| 7,751,188 B1 | * | 7/2010 | French ............... | H05K 7/20736 165/104.33 |
| 2003/0010490 A1 | * | 1/2003 | Reeck ................ | H05K 7/20572 165/222 |
| 2003/0053293 A1 | * | 3/2003 | Beitelmal et al. ............ | 361/687 |

(Continued)

*Primary Examiner* — Grant Moubry
*Assistant Examiner* — Jason Thompson
(74) *Attorney, Agent, or Firm* — Matthew G. McKinney, Esq.; Allen, Dyer et al.

(57) ABSTRACT

A system and method of cooling and ventilating for an electronics cabinet is disclosed. In a particular embodiment, the system includes a cooling unit and a distribution unit in communication with the cooling unit to blow supply air through at least one main supply line. The system further includes at least one supply branch line connected to the at least one main supply line, at least one cabinet supply line connected to the at least one supply branch line, and at least one cabinet having an inlet port and an exit port, wherein the at least one cabinet supply line is connected to the inlet port. In addition, the system includes at least one cabinet return line connected to the exit port and a main return line to receive air exiting from the at least one cabinet, wherein the main return line is in communication with the cooling unit.

13 Claims, 4 Drawing Sheets

(56) References Cited

U.S. PATENT DOCUMENTS

| | | | |
|---|---|---|---|
| 2004/0257766 A1* | 12/2004 | Rasmussen | H05K 7/20572 361/689 |
| 2005/0157472 A1* | 7/2005 | Malone | H05K 7/20563 361/724 |
| 2005/0170770 A1* | 8/2005 | Johnson | H05K 7/20736 454/184 |
| 2005/0225936 A1* | 10/2005 | Day | 361/687 |
| 2007/0034082 A1* | 2/2007 | Adair et al. | 96/63 |
| 2007/0167125 A1* | 7/2007 | Rasmussen et al. | 454/184 |
| 2009/0126293 A1* | 5/2009 | Khalili | H05K 7/2059 52/220.1 |
| 2010/0317278 A1* | 12/2010 | Novick | H05K 7/20836 454/184 |
| 2012/0006505 A1* | 1/2012 | Trojer | H05K 7/206 165/48.1 |

* cited by examiner

SYSTEM AND METHOD OF COOLING AND VENTILATING FOR AN ELECTRONICS CABINET

I. CROSS REFERENCE TO RELATED APPLICATIONS

This application claims the benefit of U.S. Provisional Application No. 61/049,997 filed May 2, 2008. The disclosure of the provisional application is incorporated herein by reference.

II. FIELD

The present disclosure relates generally to the field of ventilation and cooling systems, and in particular to a system and method of cooling and ventilating for an electronics cabinet.

III. DESCRIPTION OF RELATED ART

Computer and electronic equipment for large installations is typically mounted within cabinets. Several cabinets are placed in rows in a designated computer room. The electronic equipment generates a large amount of heat. The electronic equipment must remain relatively cool and not overheat otherwise the performance of the computer and electronic equipment is affected. The electronic equipment is mounted within the cabinets on a raised floor in a common configuration. The ventilation and cooling system pressurizes the space below the electronic cabinets and acts as a large duct with vents through the raised floor in front of the cabinets. A shortcoming of the prior art ventilation system is that a substantial amount of energy is required to cool the space below the cabinets. Accordingly, what is needed in the art is a ventilation and cooling system and method that reduces the amount of energy to cool electronic equipment but at the same time increases the efficiency of cooling the equipment.

Some existing electronics cabinets have cooling systems installed within the cabinets themselves. The cooling system for each cabinet includes a compressor, condenser, an evaporator and various other electronics and refrigerant lines. A shortcoming of that type of prior art cabinet is that there is not room within existing cabinets to retrofit a cooling system with all those components within the cabinet. Further, as cooling requirements for new electronics continues to increase, the installed cooling systems have inadequate capacity to meet the higher cooling requirements.

Notwithstanding the existence of such prior art ventilation and cooling systems, there is a need for an improved ventilation and cooling system that reduces the amount of energy to cool electronic equipment.

It is, therefore, to the effective resolution of the aforementioned problems and shortcomings of the prior art that the present invention is directed.

However, in view of the prior art at the time the present invention was made, it was not obvious to those of ordinary skill in the pertinent art how the identified needs could be fulfilled.

IV. SUMMARY

In a particular illustrative embodiment, a system for cooling electronic equipment is disclosed. The system includes a cooling unit to adjust at least a humidity and temperature of supply air and a distribution unit in communication with the cooling unit to blow the supply air through at least one main supply line. The system further includes at least one supply branch line connected to the at least one main supply line, at least one cabinet supply line connected to the at least one supply branch line, and at least one cabinet having an inlet port and an exit port, wherein the at least one cabinet supply line is connected to the inlet port. In addition, the system includes at least one cabinet return line connected to the exit port and a main return line to receive air exiting from the at least one cabinet, wherein the main return line is in communication with the cooling unit.

In another particular illustrative embodiment, a system for cooling electronic equipment is disclosed. The system includes an airtight cabinet having an inlet port and an exit port. The system further includes a cabinet supply line connected to the inlet port. In addition, the system includes a diffuser unit connected to the at least one cabinet supply line, wherein the diffuser having a plurality of adjustable nozzles to blow supply air to at least one electronic equipment rack within the cabinet.

In another particular illustrative embodiment, a method for cooling electronic equipment is disclosed. The method includes conditioning supply air to a desired humidity and temperature and blowing the supply air through at least one main supply line to at least one cabinet. The method further includes distributing the supply air within the at least one cabinet using a plurality of adjustable nozzles and without mixing with return air exiting the at least one cabinet while maintaining positive air flow. In addition, the method includes receiving return air exiting from the at least one cabinet and recirculating the return air to the supply air.

One particular advantage provided by embodiments of the system and method of cooling and ventilating for an electronics cabinet is that the amount of energy to cool electronic equipment is significantly reduced by the cool supply air being distributed directly within the electronics cabinet. Another advantage provided by disclosed embodiments is that existing electronics cabinet may be retrofitted with the system temporarily, or permanently, in a cost effective manner. In addition, the system can be installed in a plurality of different configurations dependent on the desired implementation.

Other aspects, advantages, and features of the present disclosure will become apparent after review of the entire application, including the following sections: Brief Description of the Drawings, Detailed Description, and the Claims.

V. BRIEF DESCRIPTION OF THE DRAWINGS

VI. DETAILED DESCRIPTION

Figure 1:
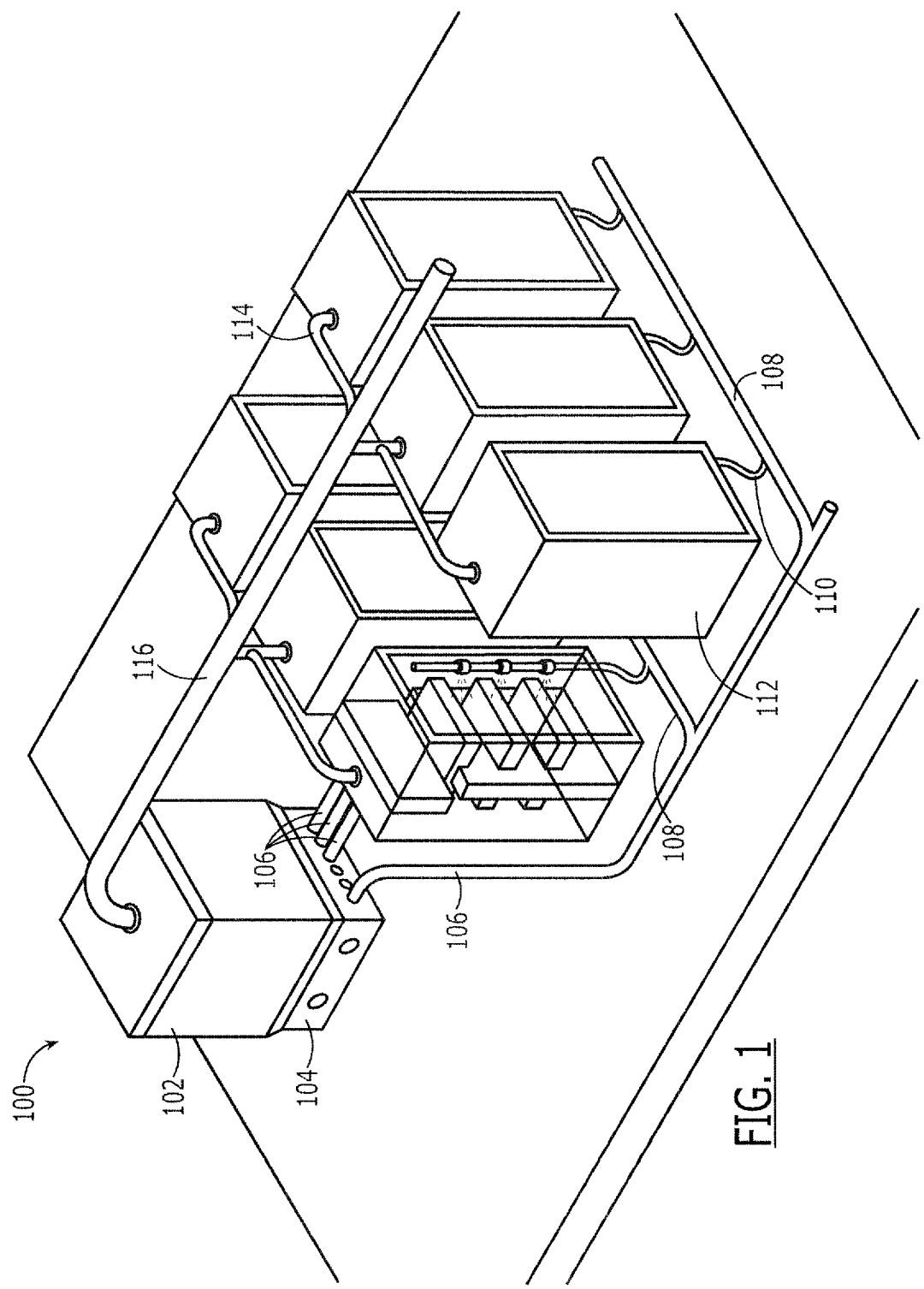
FIG. 1 is a perspective view of an illustrative embodiment of a system of cooling and ventilating for an electronics cabinet.

Referring to FIG. 1, a particular illustrative embodiment of a system of cooling and ventilating for an electronics cabinet is disclosed and generally designated 100. A cooling unit 102 adjusts the humidity and temperature of supply air that will be supplied to the system. The cooling unit 102 may include at least a compressor, a condenser, and an evaporator. However, various types of cooling units may be used with the system 100 and is not limited to closed loop refrigeration for adjusting the temperature of the supply air. A distribution unit 104 blows the supply air through at least one main supply line 106 and may pressurize the at least one main supply line 106 to a level above the internal pressure of the at least one cabinet. A fan may be used to force the supply air through the main supply line 106. As shown in FIG. 1, a plurality of supply branch lines 108 may tap into the main supply line 106 to service at least one cabinet 112. The cabinet 112 may include supports for mounting racks of electronic equipment.

A door may be installed on a front side of the cabinet 112 to access the electronic equipment. Each cabinet 112 has its own cabinet supply line 110 that receives supply air from the respective branch line 108. Additional sensors may be mounted within each cabinet 112 to monitor the humidity, temperature, or any other type of factor that may affect the performance of the electronic equipment. Accordingly, the system 100 may automatically adjust the supply air to a particular cabinet using various dampers installed on the supply branch lines and cabinet supply lines 110.

A cabinet return line 114 receives exhaust air exiting from each cabinet 112 and flows to a main return line 116 that is connected to the cooling unit 102, which conditions and recirculates the air. Makeup air may be introduced into the system 100 at the cooling unit 102 to adjust for losses in the substantially closed system 100. The distribution unit 104 may further include an ionizer unit and filters to improve the supply air quality and to meet user predefined standards.

The cabinet 112 may be substantially airtight so that an amount of supply air required for distribution to each cabinet 112 may be precisely calculated based in part on the interior volume of the cabinet 112 and particular requirements of the electronic equipment mounted therein. In addition, each supply branch line may have a damper to control a volume of supply air being distributed to each cabinet supply line. The cabinet supply line may also have a damper for controlling the volume of supply air being distributed to the cabinet 112. Accordingly, the interior environment of each cabinet 112 can be controlled easily and efficiently.

Figure 2:
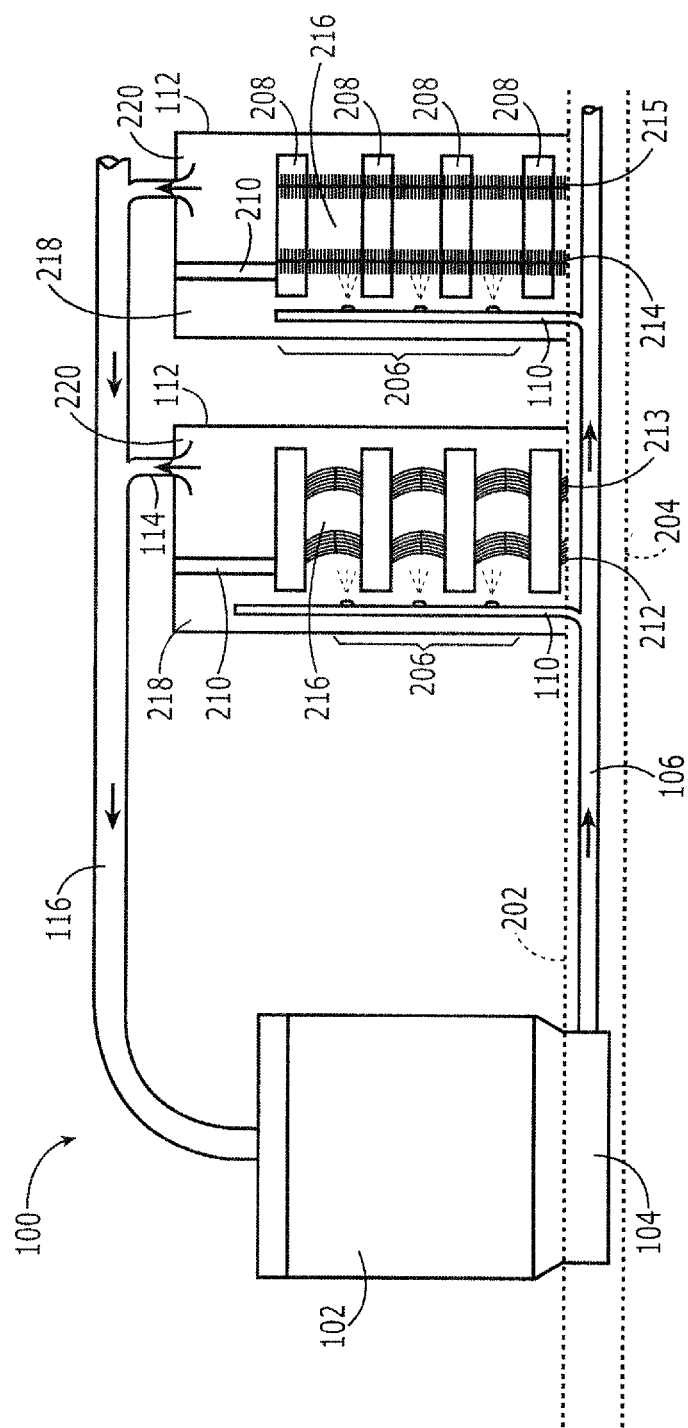
FIG. 2 is a partial elevational view of an illustrative embodiment of a system of cooling and ventilating for an electronics cabinet.

FIG. 2 is a partial elevational view of the system shown in FIG. 1, cooling unit 102 receives return air through the main return line 116 and the distribution unit 104 recirculates the conditioned supply air out through main supply line 106. The main supply line 106 may be located below a raised floor 202 that forms a corridor between a slab 204 and wherein the raised floor 202 supports at least one cabinet 112. The branch supply line 108 as shown in FIG. 1 may be connected to the main supply line 106 under the raised floor 202 and the cabinet supply line 110 may also be connected to the branch supply line 108 under the raised floor 202. The cabinet supply line 108 may project through the raised floor 202 and connect to the diffuser unit 206 or to a cabinet inlet port 318. The diffuser unit 206 is configured within each cabinet 112 in generally a vertical orientation adjacent to an edge of racks of electronic equipment 208 mounted within each cabinet 112. The diffuser unit 206 has a plurality of adjustable nozzles that blow supply air to electronic equipment racks 208. The diffuser unit 206 is adaptable to be configured to a user defined position. The adjustable nozzles control the volume, velocity and direction of supply air distributed throughout each cabinet 112 so that the supply air is directed to the periphery of each piece of electronic equipment mounted in the cabinet 112. Exhaust air is removed from each cabinet 112 through an exit port 114 that is generally mounted in an upper portion of the cabinet 112.

The diffuser unit 206 may include adjustable nozzles along a front edge of the equipment racks 208 and also along a back edge of the equipment racks 208. In addition, the cabinet supply line 110 may be connected in series to a second cabinet supply line 110. Each adjustable nozzle may have a nozzle damper to control the volume of supply air and may also be directionally adjustable.

Arrows shown in FIG. 2 illustrate the direction of the air flow through the ventilation and cooling system 100. As explained above, a distribution unit 104 blows conditioned supply air from the cooling unit 102 through main supply lines 106. The branch line 108 taps into the main supply line 106 to service a row of cabinets 112. The cooler supply air is distributed throughout each cabinet 112 using the diffuser 206 with adjustable nozzles. Each cabinet 112 has an exit port 114 that connects to the main return line 116 that circulates the return air back to the cooling unit 102. The adjustable nozzles direct the supply air more efficiently to the electronic equipment racks 208. Further, having at least one adjustable nozzle dedicated to each electronic equipment rack 208 at different vertical positions within the cabinet 112, ensures that the supply air is evenly distributed to each electronic equipment rack 208. In addition, the diffuser unit 206 uses relatively little space leaving more room for additional electronic equipment racks 208 inside the cabinet 112 rather than using space for large cooling apparatus.

As the supply air enters the cabinet 112, a front adjustable barrier 212 may be interposed between each rack 208 proximate to a front portion of the cabinet. An adjustable rear barrier 213 may be interposed between each rack 208 proximate to a rear portion of the cabinet 112. Accordingly, the front barrier 212 and rear barrier 213 assist in preventing the cool supply air from mixing with the relatively warmer exhaust air and form an insulating air space 216 between the front barrier and rear barrier 213. The front 212 and rear barriers 213 may be a bristle-brush type configuration, thermal foam material 210, or any combination thereof. In addition, the front barrier 212 and rear barrier 213 may be used together or separately depending on the application. A first front backing barrier 214 may be placed adjacent to the front barrier 212 between each cabinet 112 sidewall and racks 208 proximate to the front portion of each cabinet 112. Similarly, a rear backing barrier 215 may be placed adjacent to the rear barrier 213 between each cabinet 112 sidewall and racks 208 proximate to the rear portion of the each cabinet 112. Separating the supply air from the exhaust air may reduce moisture related problems, which are common creating corrosion and premature mechanical break-down, in addition to cooling the racks 208 more efficiently and reducing the risk of overheating. Typically, each rack 208 of computer equipment will have its own internal fan unit helping to move air through rack 208. Further, the cool supply air is distributed at a higher pressure directly to each cabinet 112 to promote air circulation through the cabinet 112 so that cabinet design may allow for higher heights than the typical four to eight feet and is a more efficient use of space of a data center without creating common cooling problems.

In an alternative embodiment, the cooling unit 102 and distribution unit 104 may be a portable unit that is connected to the diffuser unit 206 installed within each cabinet 112. Any number of cabinets 112 can be cooled and ventilated with the portable unit or multiple portable units. Accordingly, the present invention may be used as a retrofit or temporary measure to existing cooling and ventilation systems.

Figure 3:
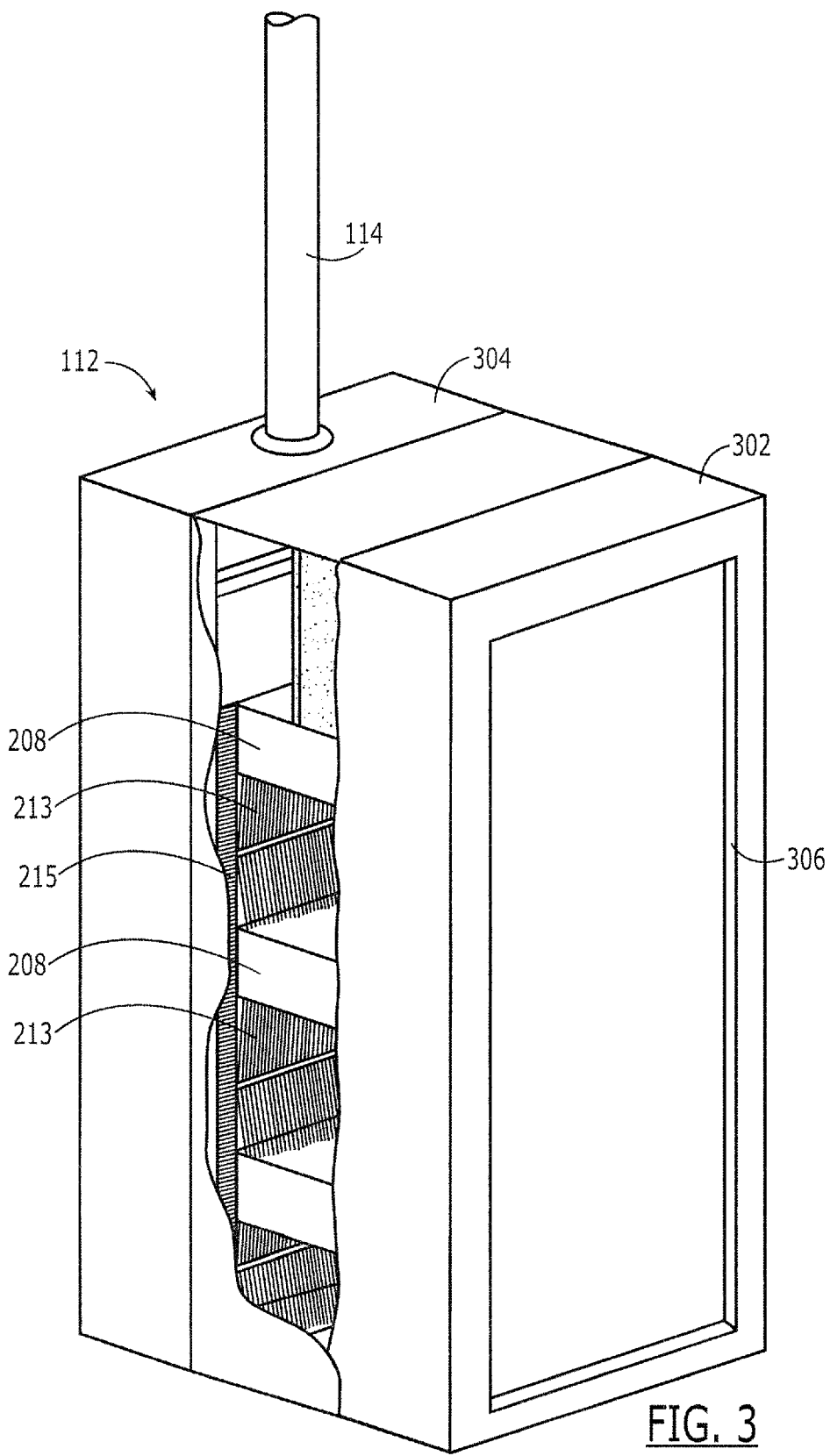
FIG. 3 is a perspective view of an electronics cabinet that may be used with the present invention.

Referring now to FIG. 3, a particular illustrative embodiment of a cabinet 112 that may be used with the system 100 is disclosed. A cabinet front portion 302 houses the diffuser unit 206 to distribute supply air to each equipment rack 208. A rear barrier 213 between each rack 208 forces the supply air to circulate through each equipment rack 208 rather than around each rack 208 to reduce the volume of supply air required within each cabinet 112. A cabinet rear portion 304 collects the exhaust air from the cabinet 112 and the exhaust air exits the cabinet 112 through the cabinet exit port 114 that is connected to the main return line 116.

Figure 4:
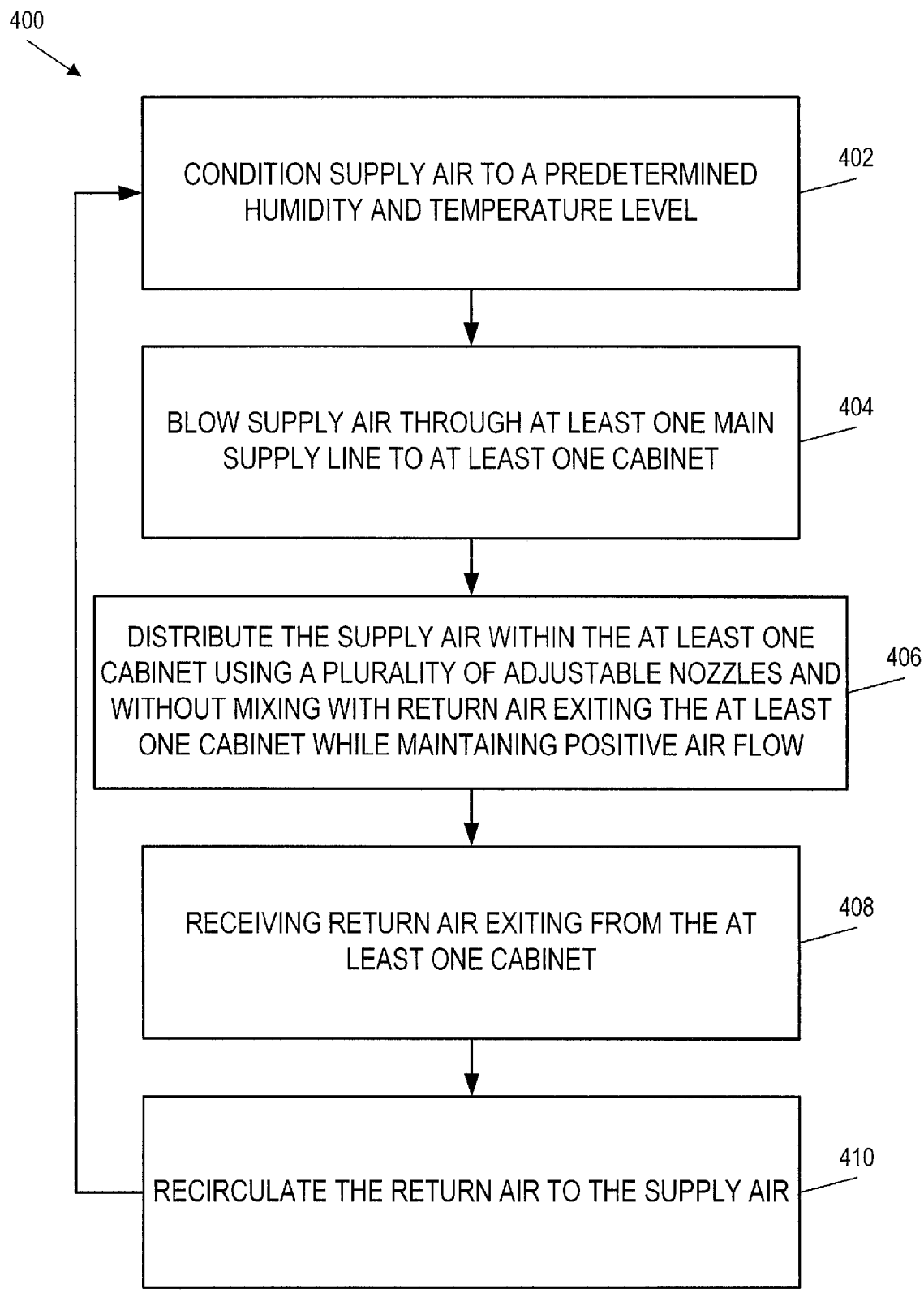
FIG. 4 is a flow diagram of a particular illustrative embodiment of a method of cooling and ventilating for an electronics cabinet.

Referring to FIG. 4, a particular illustrative embodiment of a method of cooling and ventilating for an electronics cabinet is disclosed and generally designated 400. Supply air is conditioned to a predetermined humidity and temperature level at 402. Continuing to 404, the conditioned supply air is forced through at least one main supply line to at least one cabinet. Moving to 406, the supply air is distributed within the at least one cabinet using a plurality of adjustable nozzles and without mixing with return air exiting the at least one cabinet while maintaining positive air flow. The adjustable nozzles control the distribution of an amount and direction of the supply air throughout each cabinet. The adjustable nozzles may also have a damper. The adjustable nozzles may be disposed on a front edge of electronic equipment mounted within the cabinet, a back edge of the electronic equipment, or any combination thereof. The return air from the cabinet is removed at 408 and recirculated to the supply air at 410. In another particular embodiment, the supply air is connected in series between at least a first and second cabinet.

The previous description of the disclosed embodiments is provided to enable any person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A system for cooling electronic equipment, the system comprising:
    a cabinet having an inlet port and an exit port and configured to house a plurality of electronic equipment racks;
    at least one thermal barrier comprising a front barrier and a rear barrier interposed between each rack of the plurality of electronic equipment racks substantially dividing the cabinet into at least two internal portions along an entire height of the cabinet, wherein the front and rear barriers are in direct contact with respective racks of the plurality of electronic equipment racks wherein the inlet port is located in a front portion and the exit port is located in a rear portion of the cabinet;
    the front barrier is proximate to the front portion of the cabinet;
    the rear barrier is proximate to the rear portion of the cabinet; and
    wherein the front and rear barriers define physically separate and spaced apart structures such that an air space is formed between the front barrier and the rear barrier that is substantially insulated from airflow.

2. The system of claim 1, further comprising:
    a cooling unit configured to adjust at least a humidity and temperature of supply air;
    at least one main supply line;
    a distribution unit in communication with the cooling unit and configured to blow the supply air through the at least one main supply line;
    at least one supply branch line coupled to the at least one main supply line;
    at least one cabinet supply line coupled to the at least one supply branch line;
    a main return line;
    at least one cabinet return line coupled to the exit port and the main return line to receive exhaust air exiting from the cabinet, wherein the main return line is in communication with the cooling unit; and
    a diffuser unit coupled to the at least one cabinet supply line, wherein the diffuser unit having a plurality of adjustable nozzles to blow supply air within the cabinet.

3. The system of claim 2, wherein the plurality of adjustable nozzles control distribution of an amount and direction of the supply air throughout the cabinet.

4. The system of claim 2, wherein the at least one supply branch line is coupled in series to a second cabinet supply line.

5. The system of claim 2, wherein each electronic equipment rack comprises an internal fan to move the supply air through a respective electronic equipment rack.

6. The system of claim 1, wherein the exit port is disposed on an upper portion of the cabinet.

7. The system of claim 1, wherein the cabinet is airtight.

8. The system of claim 2, wherein the cooling unit is configured to receive makeup air.

9. The system of claim 2, further comprising a raised floor to support the cabinet and forming a corridor to house the at least one main supply line and the at least one supply branch line.

10. The system of claim 2, wherein the at least one main supply line is pressurized to a level above an internal pressure of the cabinet.

11. The system of claim 2, wherein the diffuser unit is configured to a user defined position.

12. The system of claim 2, wherein the distribution unit comprises an ionizer unit.

13. A system for cooling electronic equipment, the system comprising:
    a cabinet having an inlet port and an exit port and configured to house a plurality of electronic equipment racks;
    a cabinet supply line coupled to the inlet port;
    a diffuser unit coupled to the cabinet supply line, wherein the diffuser unit having a plurality of adjustable nozzles to blow supply air within the cabinet;
    at least one thermal barrier substantially dividing the cabinet into at least two internal portions along an entire height of the cabinet, wherein the inlet port is located in a front portion for the supply air and the exit port is located in a rear portion for exhaust air;
    the at least one thermal barrier comprising a front barrier and a rear barrier between each electronic equipment rack of the plurality of electronic equipment racks to prevent the supply air from mixing with the exhaust air, wherein the front and rear barriers are in direct contact with respective racks of the plurality of electronic equipment racks; and wherein the front and rear barriers define physically separate and spaced apart structures such that an air space is formed between the front barrier and the rear barrier that is substantially insulated from airflow.

\* \* \* \* \*